(12) United States Patent
Loy et al.

(10) Patent No.: US 11,069,743 B1
(45) Date of Patent: Jul. 20, 2021

(54) NON-VOLATILE MEMORY ELEMENTS WITH A MULTI-LEVEL CELL CONFIGURATION

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/896,788

(22) Filed: Jun. 9, 2020

(51) Int. Cl.
G11C 7/18 (2006.01)
H01L 27/24 (2006.01)
H01L 45/00 (2006.01)

(52) U.S. Cl.
CPC ............ *H01L 27/2436* (2013.01); *G11C 7/18* (2013.01); *H01L 27/2472* (2013.01); *H01L 45/1206* (2013.01); *H01L 45/1253* (2013.01); *H01L 45/1675* (2013.01)

(58) Field of Classification Search
CPC ............ H01L 27/2436; H01L 27/2472; H01L 45/1675; H01L 45/1253; H01L 45/1206; G11C 7/18
USPC .................................................. 365/148, 158
See application file for complete search history.

(56) References Cited

U.S. PATENT DOCUMENTS

| | | | | |
|---|---|---|---|---|
| 9,589,652 | B1 * | 3/2017 | Lee ..................... | H01L 28/00 |
| 2003/0048674 | A1 * | 3/2003 | Kanai .................. | G11C 7/18 365/200 |
| 2003/0058686 | A1 * | 3/2003 | Ooishi ................ | G11C 11/1659 365/171 |
| 2004/0246777 | A1 * | 12/2004 | Maejima ................ | H01L 43/12 365/173 |
| 2005/0258474 | A1 * | 11/2005 | Tanaka ............... | H01L 29/66825 257/316 |
| 2006/0291266 | A1 * | 12/2006 | Zhang ................. | G11C 16/0491 365/100 |
| 2009/0073760 | A1 * | 3/2009 | Betser ................. | G11C 16/28 365/185.2 |
| 2010/0103716 | A1 * | 4/2010 | Zheng ................. | G11C 13/0069 365/148 |

(Continued)

OTHER PUBLICATIONS

Schönhals et al., "3-bit Resistive RAM Write-Read Scheme Based on Complementary Switching Mechanism", IEEE Electron Device Letters, vol. 38, No. 4, Apr. 2017.

(Continued)

*Primary Examiner* — Michael T Tran
(74) *Attorney, Agent, or Firm* — Thompson Hine LLP

(57) ABSTRACT

Structures including non-volatile memory elements and methods of fabricating a structure including non-volatile memory elements. A first non-volatile memory element includes a first electrode, a second electrode, and a switching layer between the first electrode and the second electrode. A second non-volatile memory element includes a first electrode, a second electrode, and a switching layer between the first electrode and the second electrode. A first bit line is coupled to the first electrode of the first non-volatile memory element and to the first electrode of the second non-volatile memory element. A second bit line is coupled to the second electrode of the first non-volatile memory element.

20 Claims, 4 Drawing Sheets

(56) References Cited

U.S. PATENT DOCUMENTS

| | | | |
|---|---|---|---|
| 2011/0116316 A1* | 5/2011 | Ueda | H01L 27/11521 365/185.15 |
| 2012/0257445 A1* | 10/2012 | Lee | G11C 11/165 365/158 |
| 2013/0094280 A1* | 4/2013 | Widjaja | G11C 14/0036 365/148 |
| 2014/0203345 A1* | 7/2014 | Shinagawa | G11C 16/0483 257/321 |
| 2014/0254238 A1* | 9/2014 | Gilbert | G11C 13/004 365/148 |
| 2018/0286850 A1* | 10/2018 | Maekawa | G11C 16/12 |
| 2019/0019551 A1* | 1/2019 | Lee | G11C 11/5657 |
| 2019/0198104 A1* | 6/2019 | Luo | G11C 13/0023 |
| 2019/0238135 A1* | 8/2019 | Lin | H03K 19/1737 |
| 2020/0013456 A1* | 1/2020 | Tzoufras | G11C 11/1655 |
| 2020/0075105 A1* | 3/2020 | Yoshida | G11C 16/30 |
| 2020/0135806 A1* | 4/2020 | Peng | H01L 27/228 |
| 2020/0136016 A1* | 4/2020 | Lin | H01F 10/329 |
| 2020/0144330 A1* | 5/2020 | Majhi | H01L 45/08 |
| 2020/0161328 A1* | 5/2020 | Yoon | H01L 45/1226 |
| 2020/0243135 A1* | 7/2020 | Chou | G11C 13/0038 |
| 2020/0373311 A1* | 11/2020 | Kim | H01L 45/144 |
| 2021/0005251 A1* | 1/2021 | Wang | G11C 11/161 |
| 2021/0012940 A1* | 1/2021 | Salahuddin | G11C 11/1675 |

OTHER PUBLICATIONS

Khurana, G., Kumar, N., Chhowalla, M. et al. "Non-Polar and Complementary Resistive Switching Characteristics in Graphene Oxide devices with Gold Nanoparticles: Diverse Approach for Device Fabrication" b Sci Rep 9, 15103 (2019).

Desmond Jia Jun Loy et al., "Multi-Level Cell Configurations for Non-Volatile Memory Elements in a Bitcell" filed Dec. 4, 2020 as U.S. Appl. No. 17/111,996.

C. Chou et al., "An N40 256K×44 embedded RRAM macro with SL-precharge SA and low-voltage current limiter to improve read and write performance," 2018 IEEE International Solid—State Circuits Conference—(ISSCC), San Francisco, CA, 2018, pp. 478-480.

M. Tada et al., "Highly reliable, complementary atom switch (CAS) with low programming voltage embedded in Cu BEOL for Non-volatile Programmable Logic," 2011 International Electron Devices Meeting, Washington, DC, 2011, pp. 30.2.1-30.2.4.

Linn, E., Rosezin, R., Kügeler, C. et al., "Complementary resistive switches for passive nanocrossbar memories", Nature Mater 9, 403-406 (2010).

Linn et al., "Compact modeling of CRS devices based on ECM cells for memory, logic and neuromorphic applications", Published Sep. 2, 2013 • IOP Publishing Ltd Nanotechnology, vol. 24, No. 38.

* cited by examiner

NON-VOLATILE MEMORY ELEMENTS WITH A MULTI-LEVEL CELL CONFIGURATION

BACKGROUND

The present invention relates to integrated circuits and semiconductor device fabrication and, more specifically, to structures including non-volatile memory elements and methods of fabricating a structure including non-volatile memory elements.

A resistive random-access memory (ReRAM or RRAM) device provides one type of embedded non-volatile memory technology. Because the memory elements are non-volatile, the stored bits of data are retained by the resistive random-access memory device when the memory elements are not powered. The non-volatility of a resistive random-access memory device contrasts with volatile memory technologies, such as a static random-access memory (SRAM) device in which the stored content is eventually lost when unpowered and a dynamic random-access memory (DRAM) device in which the stored content is lost if not periodically refreshed.

Data is stored in a resistive random-access memory element of a resistive random-access memory device by changing the resistance across a dielectric layer to provide different information-storage states—a high-resistance state and a low-resistance state—representing the stored bits of data. The dielectric material can be modified by applying a bias voltage sufficient to create one or more filaments as conductive paths bridging across the thickness of the dielectric material, which writes the low-resistance state. The filaments of the resistive random-access memory element are destroyed, also by the application of a bias voltage, to write the high-resistance state.

Improved structures including non-volatile memory elements and methods of fabricating a structure including non-volatile memory elements are needed.

SUMMARY

According to an embodiment of the invention, a structure includes a first non-volatile memory element having a first electrode, a second electrode, and a switching layer between the first electrode and the second electrode. The structure further includes a second non-volatile memory element including a first electrode, a second electrode, and a switching layer between the first electrode and the second electrode. A first bit line is coupled to the first electrode of the first non-volatile memory element and to the first electrode of the second non-volatile memory element. A second bit line is coupled to the second electrode of the first non-volatile memory element.

According to another embodiment of the invention, a method includes forming a first non-volatile memory element including a first electrode, a second electrode, and a switching layer between the first electrode and the second electrode, and forming a second non-volatile memory element including a first electrode, a second electrode, and a switching layer between the first electrode and the second electrode. The method further includes forming a first bit line coupled to the first electrode of the first non-volatile memory element and to the first electrode of the second non-volatile memory element, and forming a second bit line coupled to the second electrode of the first non-volatile memory element.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
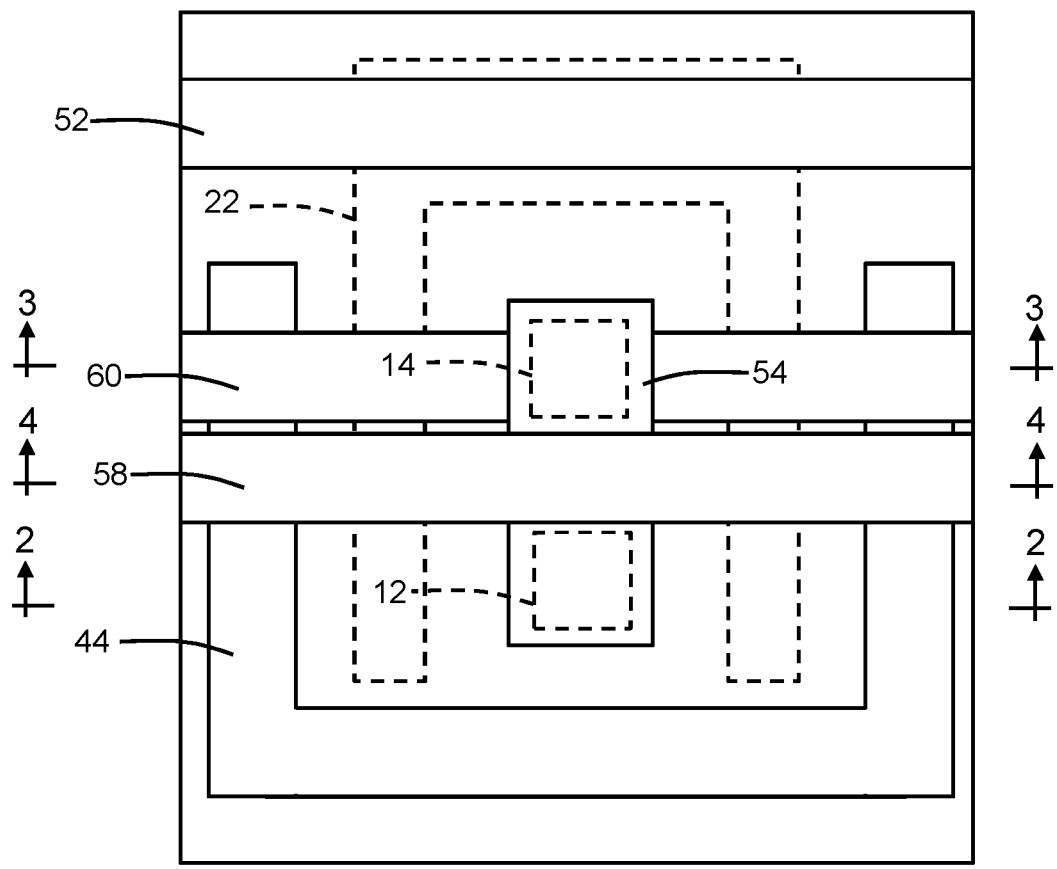
FIG. 1 is a top view of a structure for a bitcell in accordance with embodiments of the invention.
Figure 2:
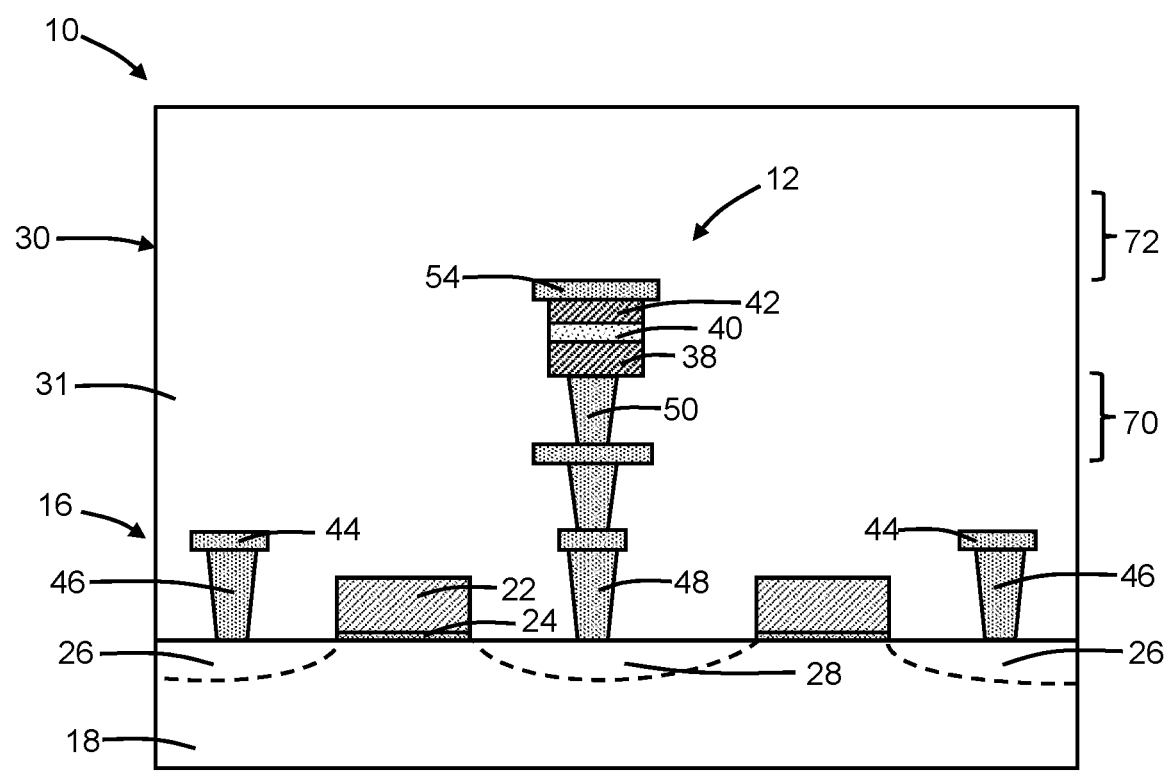
FIG. 2 is a cross-sectional view taken generally along line 2-2 in FIG. 1.
Figure 3:
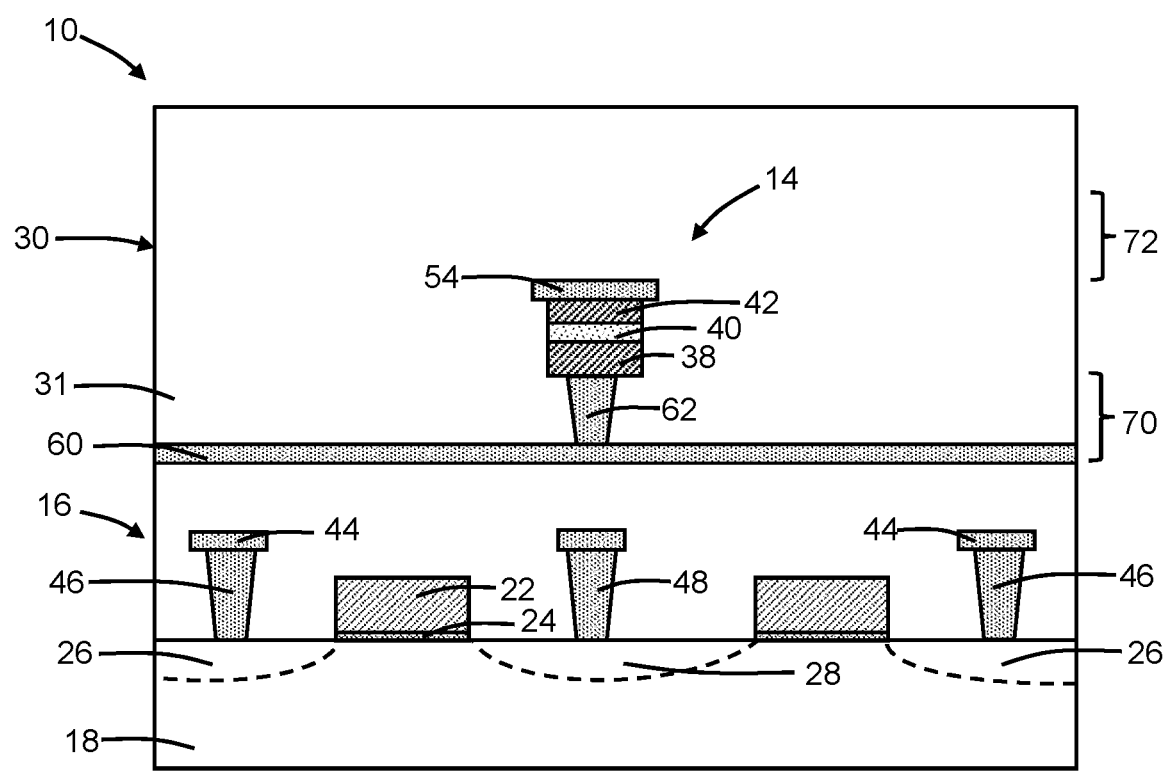
FIG. 3 is a cross-sectional view taken generally along line 3-3 in FIG. 1.
Figure 4:
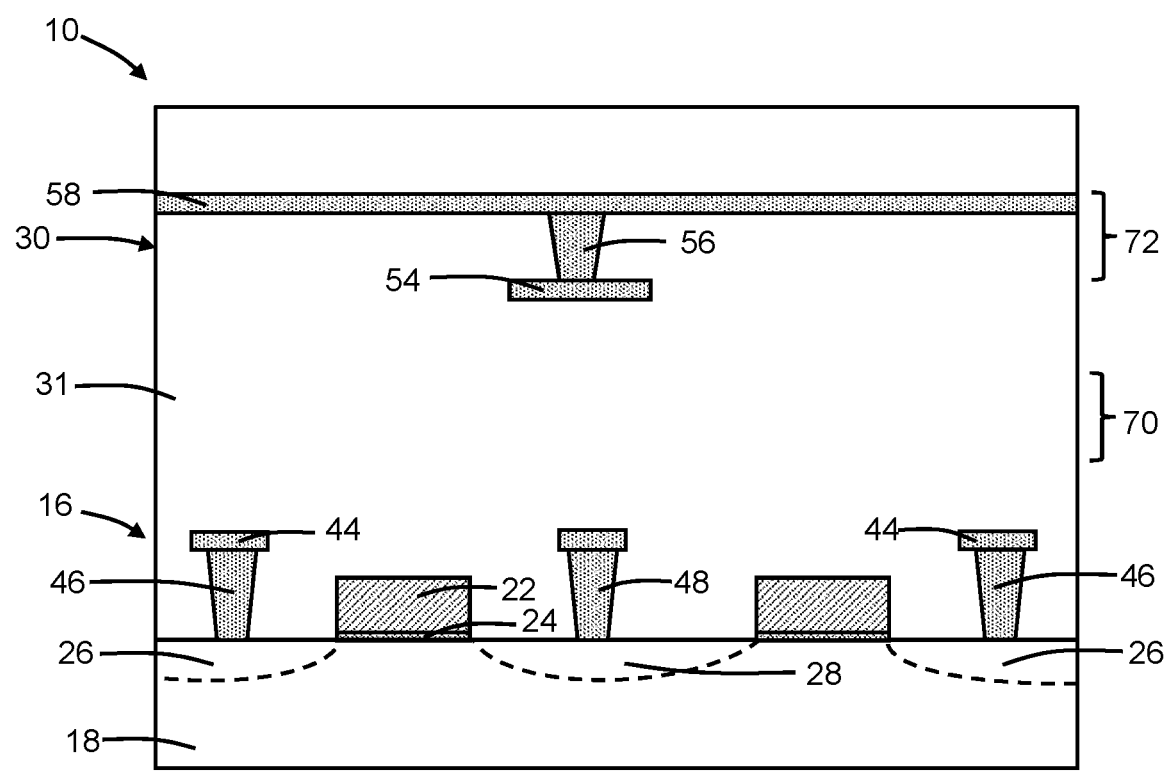
FIG. 4 is a cross-sectional view taken generally along line 4-4 in FIG. 1.

With reference to FIGS. 1-4 and in accordance with embodiments of the invention, a structure 10 for a bitcell includes a non-volatile memory element 12, a non-volatile memory element 14, and a field-effect transistor 16 that is coupled to the non-volatile memory elements 12, 14. The field-effect transistor 16 may be fabricated by front-end-of-line (FEOL) processing using a substrate 18 that contains a single-crystal semiconductor material, such as single-crystal silicon. The field-effect transistor 16 provides an access transistor for the non-volatile memory elements 12, 14. The structure 10 may be part of a memory array that includes multiple bitcells.

The field-effect transistor 16 may include a gate electrode 22, a gate dielectric layer 24, a source region 26, and a drain region 28. The gate electrode 22 may be comprised of heavily-doped polysilicon that is deposited as a blanket layer over the substrate 18 and patterned with lithography and etching processes, and the gate dielectric layer 24 may be comprised of silicon dioxide. Alternatively, the gate electrode 22 may be a metal gate formed by a gate-first process or a replacement gate process, and the gate dielectric layer 24 may be composed of a high-k dielectric material. The gate electrode 22 may include multiple fingers that are interconnected with each other. The source region 26 and drain region 28 may be doped regions located in the substrate 18. The source region 26 and drain region 28 may be doped with an n-type dopant (e.g., phosphorus and/or arsenic) that provides n-type electrical conductivity or, alternatively, may be doped with a p-type dopant (e.g., boron) that provides p-type electrical conductivity. Instead of having the representative planar design, the field-effect transistor 16 may be a fin-type field-effect transistor, a gate-all-around field-effect transistor, etc.

An interconnect structure 30 may be formed by middle-of-line (MOL) processing and/or back-end-of-line (BEOL) processing over the field-effect transistor 16 after FEOL processing is completed. The interconnect structure 30 includes metallization levels with interlayer dielectric layers 31 and metal features disposed in the interlayer dielectric layers 31. The interlayer dielectric layers 31 may be comprised of a dielectric material, such as carbon-doped silicon dioxide. Conductive features in the different metallization levels of the interconnect structure 30 interconnect the field-effect transistor 16 with the non-volatile memory elements 12, 14 and provide the connections for lines needed to read data from, and write data to, the structure 10.

The interconnect structure 30 specifically includes a metallization level 70 and a metallization level 72 that are spaced from each other in a vertical direction. The non-volatile memory elements 12, 14 have a juxtaposed arrangement in a horizontal direction. The non-volatile memory elements 12, 14 are not stacked in the vertical direction.

In an embodiment, the non-volatile memory elements 12, 14 may be constructed as resistive memory elements that include a bottom electrode 38, a switching layer 40 located on the bottom electrode 38, and a top electrode 42 located on the switching layer 40. The switching layer 40 is positioned in a vertical direction between the bottom electrode 38 and the top electrode 42. The bottom electrode 38 may be comprised of a metal, such as ruthenium, platinum, titanium nitride, or tantalum nitride. The top electrode 42 may be comprised of a metal, such as tantalum, hafnium, titanium, copper, silver, cobalt or tungsten. The switching layer 40 may be comprised of a dielectric material, such as silicon dioxide, silicon nitride, or a metal oxide (e.g., magnesium oxide, tantalum oxide, hafnium oxide, titanium oxide, silicon oxide, or aluminum oxide). The bottom electrode 38, switching layer 40, and the top electrode 42 of both non-volatile memory elements 12, 14 may be formed by lithography and etching deposited layers of their constituent materials.

Data is stored in the structure 10 including the non-volatile memory elements 12, 14 by changing the individual resistances across their switching layers 40 to provide different levels of resistance. The dielectric material, which is normally insulating, can be made to conduct through one or more filaments or conductive paths generated by applying a sufficiently high voltage. Filaments are created in order to write the low-resistance state of each of the non-volatile memory elements 12, 14, and filaments are destroyed in order to write the high-resistance state of each of the non-volatile memory elements 12, 14. In combination, the low-resistance states and the high-resistance states of the non-volatile memory elements 12, 14 may be used to store multiple data in multiple (e.g., four) levels. In an embodiment, the non-volatile memory elements 12, 14 may have nominally equal sizes such that their resistance values in the high-resistance state are approximately equal and their resistance values in the low-resistance state are approximately equal.

The interconnect structure 30 includes a select line 44 that is physically and electrically connected by one or more source contacts 46 with the source region 26 of the field-effect transistor 16. The metallization levels of the interconnect structure 30 also include one or more drain contacts 48, metal islands, and one or more vias 50 that physically and electrically connect the drain region 28 of the field-effect transistor 16 with the bottom electrode 38 of the non-volatile memory element 12. A word line 52 is coupled by one or more vias (not shown) to the gate electrode 22 of the field-effect transistor 16.

A bit line strap 54 is physically and electrically connected to the top electrode 42 of the non-volatile memory element 12 and to the top electrode 42 of the non-volatile memory element 14. The bit line strap 54 is coupled by one or more vias 56 to a bit line 58, and a bit line 60 is coupled by one or more vias 62 to the bottom electrode 38 of the non-volatile memory element 14. The bit lines 58, 60 are arranged in different metallization levels of the interconnect structure 30, and the bit line 60 is aligned parallel, or substantially parallel, to the bit line 58. The bit line 60 is not coupled to the bottom electrode 38 of the non-volatile memory element 12. During use, the bit lines 58, 60 permit access to both non-volatile memory elements 12, 14. The bit line strap 54 and the non-volatile memory elements 12, 14 are positioned in a vertical direction between the bit line 58 and the bit line 60.

The source contacts 46 and drain contacts 48 may be formed in contact openings defined by lithography and etching in one of the interlayer dielectric layers. The source contacts 46 and drain contacts 48 may each include a lower portion containing a metal silicide, such as tungsten silicide, titanium silicide, nickel silicide, or cobalt silicide, formed by silicidation, and an upper portion containing a metal, such as tungsten, that is deposited by chemical vapor deposition and planarized. The select line 44, the vias 50, the word line 52, the bit line strap 54, the bit lines 58, 60, and the metal islands in each metallization level may be formed by a damascene process and may be composed of a metal, such as copper.

In use, the non-volatile memory elements 12, 14 may both be switched from high-resistance states to low-resistance states by a set operation to provide a level. One or both of the non-volatile memory elements 12, 14 may be switched from a low-resistance state to a high-resistance state by a reset operation to provide additional levels. The reset operation may place the combination of the non-volatile memory elements 12, 14 in state combinations with one of the non-volatile memory elements 12, 14 in a low-resistance state and the other of the non-volatile memory elements 12, 14 in a high-resistance state, or a state combination in which both of the non-volatile memory elements 12, 14 are placed a high-resistance states. The state combinations of the non-volatile memory elements 12, 14 provide additional levels. The structure 10 is therefore capable of being programmed in any of multiple (e.g., four) levels. The bit line 60 provides an additional biasing mechanism to control the reset process to provide the different levels.

In an alternative embodiment, the non-volatile memory elements 12, 14 may be phase change material (PCM) memory elements that include a phase change material as the switching layer 40. The phase change material may be a chalcogenide glass, such as $Ge_2Sb_2Te_5$, and may be heated to provide an amorphous phase or a crystalline phase that respectively define the high-resistance and low-resistance states. The phase change material may be heated by applying an electrical current that is sufficient to cause melting. Depending on the current magnitude and pulsing of the current, the molten phase change material can subsequently crystallize or remain amorphous, thereby achieving different resistances.

In an alternative embodiment, the non-volatile memory elements 12, 14 may be ferroelectric memory elements that include a ferroelectric material as the switching layer 40. The ferroelectric material of the switching layer 40 may be, for example, lead zirconate titanate (PZT).

In an alternative embodiment, the non-volatile memory elements 12, 14 may be magnetic tunnel junction memory elements. In that regard, each non-volatile memory element may include a pinned or fixed layer, a tunnel barrier layer, and a free layer that are arranged in a layer stack between the bottom and top electrodes. The fixed layer may include one or more layers, such as a reference layer and a hard layer, that are composed of a magnetic material, such as a cobalt-platinum alloy or a cobalt-iron-boron alloy. The tunnel barrier layer may be composed of a non-magnetic, dielectric material, such as magnesium oxide or aluminum oxide. The free layer, which provides the switching layer 40, may include one or more layers composed of a magnetic alloy, such as a cobalt-iron-boron alloy. The magnetization of the reference layer of the fixed layer is pinned such that the magnetization vector cannot flip (i.e., rotate) under the influence of a programming current. The magnetization of the free layer is not pinned such that the magnetization vector can flip (i.e., rotate) under the influence of a programming current.

The field-effect transistor 16 and non-volatile memory elements 12, 14 have a 1T2R (one-transistor, two-resistor) multi-level cell (MLC) configuration capable of storing multiple bits in a single bitcell, which may lead to improvements in density and a reduction in the cost-per-bit for a memory device. The density improvement may be achieved with a smaller area in comparison with the use of a pair of 1T1R (one-transistor, one-resistor) bitcells. The fabrication of both non-volatile memory elements 12, 14 by the same lithography and etching processes may improve the fabrication efficiency for a 1T2R configuration in comparison with an arrangement in which the non-volatile memory elements are stacked over each other.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first non-volatile memory element including a first electrode, a second electrode, and a switching layer between the first electrode and the second electrode;
    a second non-volatile memory element including a first electrode, a second electrode, and a switching layer between the first electrode and the second electrode;
    a bit line strap coupled to the first electrode of the first non-volatile memory element and the first electrode of the second non-volatile memory element;
    a first bit line coupled by the bit line strap to the first electrode of the first non-volatile memory element and to the first electrode of the second non-volatile memory element; and
    a second bit line coupled to the second electrode of the first non-volatile memory element.

2. The structure of claim 1 wherein the switching layer of the first non-volatile memory element and the switching layer of the second non-volatile memory element each comprise a dielectric material.

3. The structure of claim 1 wherein the switching layer of the first non-volatile memory element and the switching layer of the second non-volatile memory element each comprise a phase change material.

4. The structure of claim 1 wherein the switching layer of the first non-volatile memory element and the switching layer of the second non-volatile memory element each comprise a ferroelectric material.

5. The structure of claim 1 wherein the first non-volatile memory element and the second non-volatile memory element are positioned in a vertical direction between the first bit line and the second bit line.

6. The structure of claim 5 wherein the first non-volatile memory element and the second non-volatile memory element have a juxtaposed arrangement in a horizontal direction.

7. The structure of claim 1 further comprising:
    a field-effect transistor including a drain,
    wherein the drain of the field-effect transistor is coupled to the second electrode of the second non-volatile memory element.

8. The structure of claim 1 wherein the bit line strap is positioned between the first bit line and the first electrode of the first non-volatile memory element, and the bit line strap is positioned between the first bit line and the first electrode of the second non-volatile memory element.

9. The structure of claim 1 wherein the bit line strap, the first non-volatile memory element, and the second non-volatile memory element are positioned in a vertical direction between the first bit line and the second bit line.

10. A method comprising:
    forming a first non-volatile memory element including a first electrode, a second electrode, and a switching layer between the first electrode and the second electrode;
    forming a second non-volatile memory element including a first electrode, a second electrode, and a switching layer between the first electrode and the second electrode;

forming a first bit line coupled to the first electrode of the first non-volatile memory element and to the first electrode of the second non-volatile memory element; and forming a second bit line coupled to the second electrode of the first non-volatile memory element, wherein the first non-volatile memory element and the second non-volatile memory element are positioned between the first bit line and the second bit line, and the first non-volatile memory element and the second non-volatile memory element have a juxtaposed arrangement.

11. The method of claim 10 wherein the first non-volatile memory element and the second non-volatile memory element are concurrently formed by lithography and etching processes.

12. The method of claim 10 wherein the first non-volatile memory element and the second non-volatile memory element are positioned between adjacent metallization levels of an interconnect structure.

13. The method of claim 10 further comprising:
forming a field-effect transistor; and
coupling a drain of the field-effect transistor to the second electrode of the second non-volatile memory element.

14. The method of claim 13 further comprising:
forming a bit line strap coupling the first electrode of the first non-volatile memory element to the first electrode of the second non-volatile memory element.

15. The method of claim 14 wherein the bit line strap couples the first bit line to the first electrode of the first non-volatile memory element and to the first electrode of the second non-volatile memory element.

16. The method of claim 15 wherein the bit line strap is positioned between the first bit line and the second bit line.

17. The structure of claim 1 further comprising:
an interconnect structure including a first metallization level and a second metallization level,
wherein the first non-volatile memory element and the second non-volatile memory element are positioned between the first metallization level and the second metallization level.

18. The method of claim 10 wherein the switching layer of the first non-volatile memory element and the switching layer of the second non-volatile memory element each comprise a dielectric material.

19. The method of claim 10 wherein the switching layer of the first non-volatile memory element and the switching layer of the second non-volatile memory element each comprise a phase change material.

20. The method of claim 10 wherein the switching layer of the first non-volatile memory element and the switching layer of the second non-volatile memory element each comprise a ferroelectric material.

* * * * *